(12) United States Patent
Kawakami et al.

(10) Patent No.: US 7,495,257 B2
(45) Date of Patent: Feb. 24, 2009

(54) LIGHT EMITTING DEVICE

(75) Inventors: Takahiro Kawakami, Kanagawa (JP); Kaoru Tsuchiya, Kanagawa (JP); Takeshi Nishi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 288 days.

(21) Appl. No.: 11/016,971

(22) Filed: Dec. 21, 2004

(65) Prior Publication Data

US 2005/0145861 A1    Jul. 7, 2005

(30) Foreign Application Priority Data

Dec. 26, 2003    (JP)    ............... 2003-432207

(51) Int. Cl.
*H01L 29/04*    (2006.01)

(52) U.S. Cl. ............... 257/59; 257/72; 257/291; 257/449; 349/136; 349/137

(58) Field of Classification Search ............... 257/59
See application file for complete search history.

(56) References Cited

U.S. PATENT DOCUMENTS

| | | | |
|---|---|---|---|
| 5,640,067 A | 6/1997 | Yamauchi et al. | |
| 5,897,328 A | 4/1999 | Yamauchi et al. | |
| 5,986,729 A | 11/1999 | Yamanaka et al. | |
| 6,147,667 A | 11/2000 | Yamazaki et al. | |
| 6,160,272 A | 12/2000 | Arai et al. | |
| 6,448,580 B1 | 9/2002 | Arai et al. | |
| 6,656,779 B1 * | 12/2003 | Kasahara | 438/166 |
| 6,734,463 B2 | 5/2004 | Ishikawa | |
| 6,760,004 B2 | 7/2004 | Koyama | |
| 6,781,746 B2 | 8/2004 | Yamazaki et al. | |
| 6,791,129 B2 | 9/2004 | Inukai | |
| 6,798,442 B1 | 9/2004 | Kim et al. | |
| 6,853,083 B1 | 2/2005 | Yamauchi et al. | |
| 6,861,710 B2 | 3/2005 | Murakami et al. | |

(Continued)

FOREIGN PATENT DOCUMENTS

CN    1381899    11/2002

(Continued)

OTHER PUBLICATIONS

Office Action received in Chinese Patent Application No. 200410094253.6 dated May 30, 2008 with English translation.

*Primary Examiner*—Jerome Jackson, Jr.
*Assistant Examiner*—Jose R Diaz
(74) *Attorney, Agent, or Firm*—Nixon Peabody LLP; Jeffrey L. Costellia

(57) ABSTRACT

An object of the present invention is to provide a light emitting device in which variations in an emission spectrum depending on a viewing angle with respect to a side from which luminescence is extracted are decreased. A light emitting device according to the invention has a transistor, an insulating layer covering the transistor and a light emitting element provided in an opening of the insulating layer. The transistor and the light emitting element are electronically connected through a connecting portion. Additionally, the connecting portion is connected to the transistor through a contact hole penetrating the insulating layer. Note that the insulating layer may be a single layer or a multilayer in which a plurality of layers including different substances is laminated.

37 Claims, 15 Drawing Sheets

U.S. PATENT DOCUMENTS

| | | |
|---|---|---|
| 6,888,304 B2 | 5/2005 | Sato |
| 6,903,377 B2 | 6/2005 | Yamazaki et al. |
| 6,958,252 B2 * | 10/2005 | Kim .......................... 438/34 |
| 6,992,435 B2 | 1/2006 | Yamauchi et al. |
| 7,042,024 B2 | 5/2006 | Yamazaki et al. |
| 7,095,046 B2 | 8/2006 | Ishikawa |
| 7,112,462 B2 | 9/2006 | Arai et al. |
| 7,133,086 B2 * | 11/2006 | Toyota et al. ................. 349/38 |
| 7,264,981 B2 | 9/2007 | Kim |
| 7,319,243 B2 | 1/2008 | Kim |
| 2002/0014628 A1 * | 2/2002 | Koyama ..................... 257/72 |
| 2002/0047120 A1 | 4/2002 | Inukai |
| 2002/0140643 A1 | 10/2002 | Sato |
| 2003/0089991 A1 | 5/2003 | Yamazaki et al. |
| 2003/0116768 A1 | 6/2003 | Ishikawa |
| 2003/0127651 A1 * | 7/2003 | Murakami et al. ............ 257/72 |
| 2003/0129790 A1 | 7/2003 | Yamazaki et al. |
| 2003/0206332 A1 | 11/2003 | Yamazaki et al. |
| 2004/0160171 A1 | 8/2004 | Takahashi |
| 2004/0188692 A1 | 9/2004 | Ishikawa |
| 2005/0145861 A1 | 7/2005 | Kawakami et al. |
| 2005/0161680 A1 | 7/2005 | Kawakami et al. |
| 2005/0179372 A1 | 8/2005 | Kawakami et al. |
| 2006/0087222 A1 | 4/2006 | Yamauchi et al. |

FOREIGN PATENT DOCUMENTS

| | | |
|---|---|---|
| GB | 2286081 | 8/1995 |
| JP | 07-211458 | 8/1995 |
| JP | 08-330600 | 12/1996 |
| JP | 10-254383 | 9/1998 |
| JP | 10-289784 | 10/1998 |
| JP | 2000-162647 | 6/2000 |
| JP | 2002-287666 | 10/2002 |

* cited by examiner

LIGHT EMITTING DEVICE

BACKGROUND OF THE INVENTION

1. Field of the Invention

The present invention relates to an active matrix light emitting device. More specifically, the invention relates to a structure of the part from which luminescence is extracted.

2. Description of the Related Art

A light emitting device using luminescence out of an electroluminescent element (a light emitting element) attracts attention as a display device of wide viewing angle and low power consumption.

There are an active matrix type and a passive matrix type as driving methods for a light emitting device which is mainly used for display. In a light emitting device of an active matrix type driving method, emission state, non-emission state or the like can be controlled in every light emitting element. Therefore, it can be driven with smaller power consumption than a passive matrix light emitting device, and it is suitable for being mounted not only as a display portion of a small electric appliance such as a mobile phone but also as a display portion of a large-size television receiver or the like.

In addition, in an active matrix light emitting device, each light emitting element is provided with a circuit for controlling the drive of the respective light emitting element. The circuit and the light emitting element are disposed over a substrate so that extraction of luminescence to the outside is not prevented by the circuit. Light-transmitting insulating layers are laminated in a part superposing with the light emitting element, and luminescence is emitted outside through the insulating layer. These insulating layers are provided in order to form a transistor which is a component of the circuit, a circuit element such as a capacitor element or a wiring.

Luminescence sometimes interferes each other multiple times according to the difference in a refractive index of each insulating layer. As a result, a problem that an emission spectrum varies depending on a viewing angle with respect to a side from which luminescence is extracted and visibility of an image displayed in the light emitting device is deteriorated is caused.

In addition, deterioration in visibility of an image due to the difference of a refractive index of each layer occurs also in a passive matrix display device. For example, Reference 1: Japanese Patent Laid-Open No. Hei 7-211458 raises a problem that external light and luminescence are reflected at an interface due to the difference of a refractive index of each layer which constitutes a light emitting element, and visibility is deteriorated. Patent Document 1 also suggests a light emitting element with an element structure capable of solving the above problem.

SUMMARY OF THE INVENTION

An object of the present invention is to provide a light emitting device in which variations in an emission spectrum depending on a viewing angle with respect to a side from which luminescence is extracted are reduced.

According to one aspect of the invention, the light emitting device has a transistor, an insulating layer covering the transistor and a light emitting element provided in an opening in the insulating layer.

Here, the transistor and the light emitting element are electronically connected through a connecting portion. In addition, the connecting portion is connected to the transistor through a contact hole penetrating the insulating layer.

Note that the insulating layer may be a single layer or a multilayer in which a plurality of layers including different substances is laminated.

A light emitting device according to the invention has a transistor, a light emitting element, an insulating layer covering the transistor and a bank layer covering the insulating layer. A first opening is provided in the insulating layer. In addition, a second opening is provided in the bank layer. The second opening is provided inside of the first opening, and the light emitting element is provided in the second opening.

Here, the transistor and the light emitting element are electronically connected through a connecting portion. In addition, the connecting portion is connected to the transistor through the contact hole penetrating the insulating layer.

Note that the insulating layer may be a single layer or a multilayer in which a plurality of layers including different substances is laminated.

A light emitting device according to the invention has a transistor and an insulating layer covering the transistor. The insulating layer has a first opening, and a first electrode is provided so as to cover the first opening. Further, a bank layer covering the insulating layer is provided. The bank layer has a second opening. In the second opening, a part of the first electrode is exposed. A light emitting layer is provided over the first electrode which is exposed from the second opening, and a second electrode is provided on the light emitting element.

Here, the transistor and the light emitting element are electrically connected through a connecting portion. In addition, the connecting portion is connected to the transistor through a contact hole penetrating the insulating layer. Moreover, the first electrode is formed of a conductive substance having light transmitting properties.

Note that the insulating layer may be a single layer or a multilayer in which a plurality of layers including different substances is laminated.

A light emitting device according to the invention has a light emitting element and a transistor. The light emitting element is formed over a first insulating layer such that a light emitting layer is sandwiched between a first electrode and a second electrode. In addition, the transistor is formed over a second insulating layer provided on the first insulating layer such that a third insulating layer is sandwiched between a semiconductor layer and a third electrode. Moreover, the transistor is covered with a fourth insulating layer. The third insulating layer has an opening, and the light emitting element is provided in the opening. Further, the first electrode and the semiconductor layer are provided in the same layer.

Here, the semiconductor layer and the first electrode are connected electronically through a connecting portion. The connecting portion is connected to the transistor though a contact hole penetrating the insulating layer. In addition, the first electrode formed from a conductive substance having light transmitting properties.

Note that the third insulating layer may be a single layer or a multilayer in which a plurality of layers including different substances is laminated.

According to the invention, a light emitting device in which variations in an emission spectrum depending on a viewing angle with respect to a side from which luminescence is extracted are reduced can be obtained.

In addition, by reducing variations in an emission spectrum depending on a viewing angle with respect to a side from which luminescence is extracted, a display device or the like capable of providing an image with superior visibility can be obtained.

These and other objects, features and advantages of the present invention will become more apparent upon reading of the following detailed description along with the accompanied drawings.

DETAILED DESCRIPTION OF THE INVENTION

Figure 1:
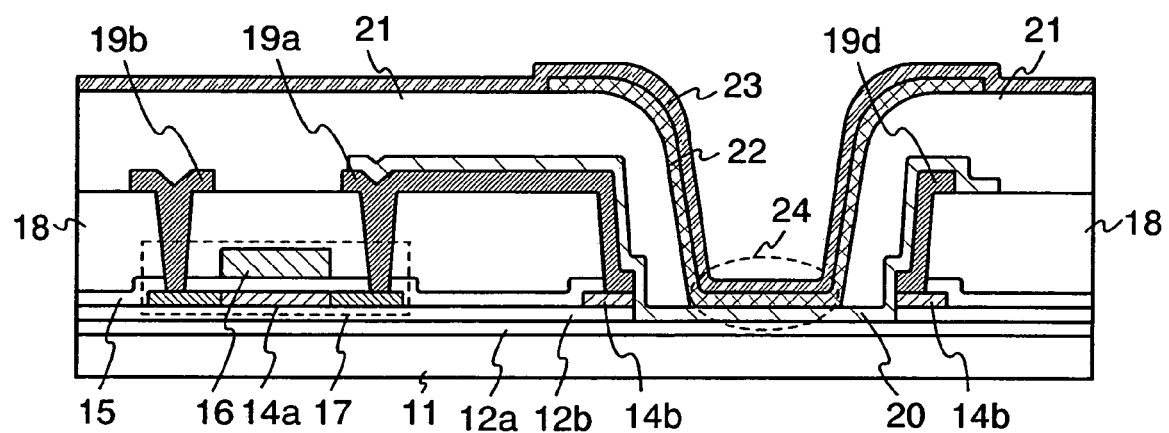
FIG. 1 is a view illustrating a structure of a light emitting device according to certain aspect of the present invention.

One mode of the invention will be described below with reference to the accompanying drawings. However, it is to be understood that various changes and modifications will be apparent to those skilled in the art. Therefore, the invention is not interpreted with limiting to the description in this embodiment.

Embodiment Mode 1

A light emitting device according to the present invention is described with reference to FIG. 1.

An insulating layer 12 having two-layers of insulating layers 12a and 12b is provided over a substrate 11. On the insulating layer 12b, a staggered transistor 17 including a semiconductor layer 14a, a gate insulating layer 15 and a gate electrode 16 is provided. In addition, the transistor 17 is covered with an insulating layer 18.

Here, an object having light-transmitting properties such as glass or quartz is used for the substrate 11. In addition, an object having flexibility such as plastics may be used for the substrate 11. Besides, any object can be used for the substrate 11 as long as it has light-transmitting properties and functions as a support medium for supporting the transistor 17 and a light emitting element 24.

In this embodiment, the insulating layers 12a and 12b are provided in order to prevent impurities which diffuse from the substrate 11 from being mixed into the transistor 17. The insulating layers 12a and 12b include different substances, respectively. Note that the insulating layers 12a and 12b are preferably include a layer composed of silicon oxide, silicon nitride, silicon nitride containing oxygen or the like. Alternatively, they may be layers including other materials. Although the insulating layer 12 is a multilayer in this embodiment, it may be a single layer. Additionally, when the mixture of impurities from the substrate 11 is restrained sufficiently, it is not particularly necessary to provide the insulating layer 12.

The light emitting element 24 is formed on an insulating layer 12a such that a light emitting layer 22 is sandwiched between a first electrode 20 and a second electrode 23. The first electrode 20 contacts with the insulating layer 12a. Additionally, it is more preferable that the insulating layer 12a is a film having a function of preventing impurities from diffusing as described above and includes a substance of which a refractive index is equal to or a smaller than that of the first electrode 20.

Note that one of the first electrode 20 and the second electrode 23 functions as an anode, and the other functions as a cathode. Additionally, it is preferable that the first electrode 20 includes a conductive substance having light-transmitting properties such as indium tin oxide (ITO). Note that ITO containing silicon oxide, IZO (Indium Zinc Oxide) in which zinc oxide (ZnO) of 2% to 20% is mixed into indium tin oxide, or the like may be used as well as ITO.

The light emitting layer 22 includes a light emitting substance and is formed of a single layer or a multilayer. In addition, the light emitting layer 22 may be an object including either an inorganic material or an organic material; alternatively, it may be an object including both of the above.

The transistor 17 and the light emitting element 24 are electronically connected through a connecting portion 19a including a conductor. Note that the connecting portion 19a is provided on the insulating layer 18, and further reaches the semiconductor layer 14a through a contact hole penetrating the insulating layer 18. In addition, a part or entire part of the connecting portion 19a is in contact with the first electrode 20.

A first opening is provided in the insulating layer 18 such that a part of the insulating layer 12a is exposed. Then, the first electrode 20 is provided so as to cover the first opening. Note that it is not always necessary to cover the entire opening with the first electrode 20 as long as the first electrode 20 is provided so as to cover the insulating layer 12a exposed from the opening. Further, a bank layer 21 having the second opening is provided so as to expose a part of the first electrode 20. In addition, the other part (the connecting portion 19a, a wiring 19b, the insulating layer 18 and the like) are covered with the bank layer 21.

In the second opening, the light emitting layer 22 is provided on the first electrode 20, and further, the second electrode 23 is provided on the light emitting layer 22. The part in which the first electrode 20, the light emitting layer 22 and the second electrode 23 are laminated in this manner functions as the light emitting element 24.

In addition, in a light emitting device shown in FIG. 1, the connecting portion 19a and the first electrode 20 are laminated over a sidewall of the insulating layer 18. By adopting such a structure, the connection between the first electrode 20 and the connecting portion 19a can be kept even when either the first electrode 20 or the connecting portion 19a cannot cover the sidewall of the insulating layer 18 sufficiently. Moreover, like a light emitting device shown in FIG. 1, a film 19d formed in the same layer as the connecting portion 19a may be provided so as to cover the entire sidewall of the insulating layer 18. Note that the connecting portion 19a and the film 19d may be formed either integrally with each other or not.

Note that the insulating layer 18 may have multilayer structure including a plurality of layers, or a single layer structure. In addition, the insulating layer 18 may include either an inorganic materials such as silicon oxide, siloxane or silicon nitride or an organic materials such as acryl or polyimide. The insulating layer 18 may include both an inorganic material and an organic material. In either case, it is acceptable as long as the material is the insulator.

Figure 3:
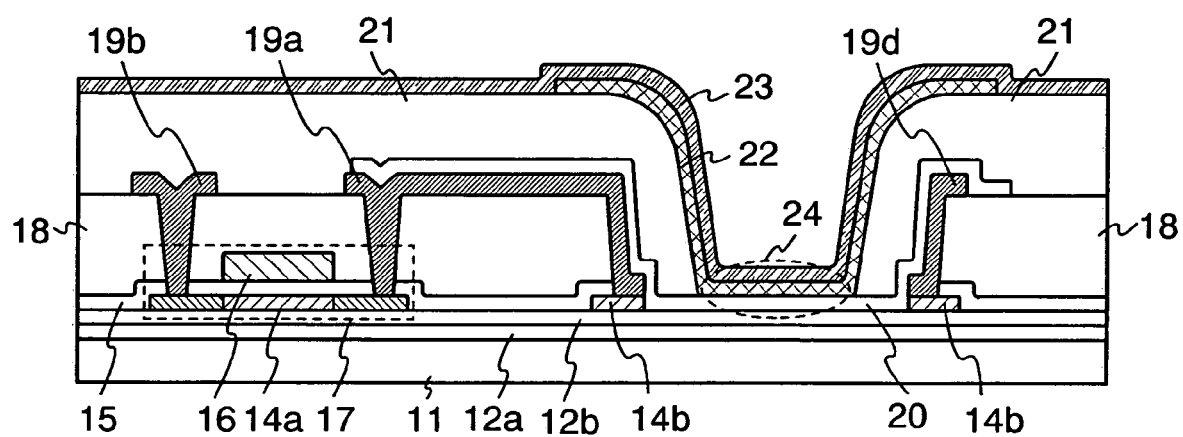
FIG. 3 is a view illustrating a structure of a light emitting device according to certain aspect of the present invention.

In a light emitting device according to the invention, both of the transistor 17 and the light emitting element 24 are provided over the insulator such as the insulating layer 12a or 12b. Moreover, particularly in FIG. 1, the semiconductor layers 14a and 14b are provided on the insulating layer 12b, and the first electrode 20 is provided over the insulating layer 12a. Thus, the semiconductor layers 14a and 14b and the first electrode 20 may be provided over the different layers or on the same layer. For example, the semiconductor layers 14a and 14b may be provided on the insulating layer 12a, or the first electrode 20 may be provided over the insulating layer 12b (FIG. 3). Here, when the insulating layers 12a and 12b are formed between the substrate 11 and the first electrode 20 as shown in FIG. 3, the substrate 11 and the insulating layers 12a and 12b are preferably selected to have almost the same refractive index. Alternatively, it is preferable that the insulating layers 12a and 12b laminated so that each refractive index is sequentially decreased and the refractive index of the substrate 11 is the smallest. In either case, any structure is acceptable as long as it is such a structure in which the transistor 17 and the light emitting element 24 are provided over the insulator, and diffusion of impurities from the substrate 11 to the transistor 17 can be prevented.

Figure 4:
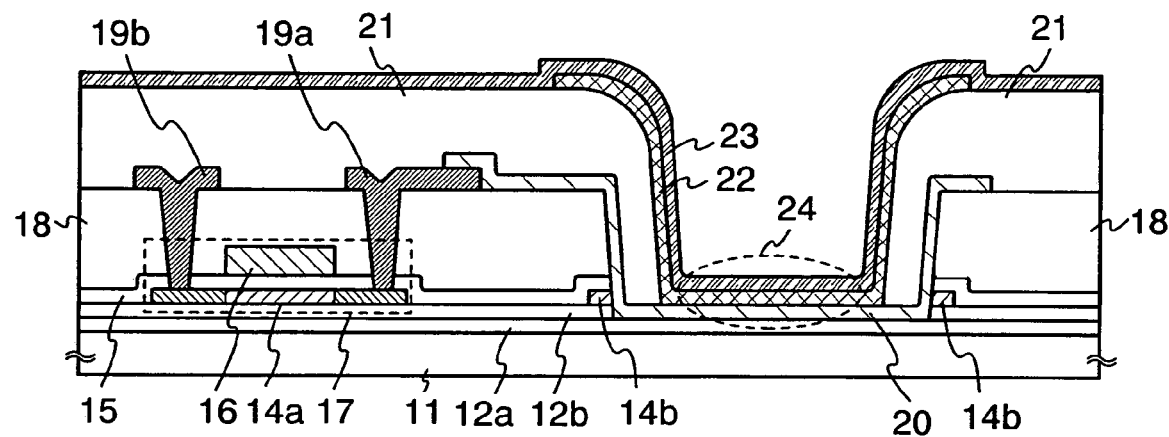
FIG. 4 is a view illustrating a structure of a light emitting device according to certain aspect of the present invention.
Figure 5:
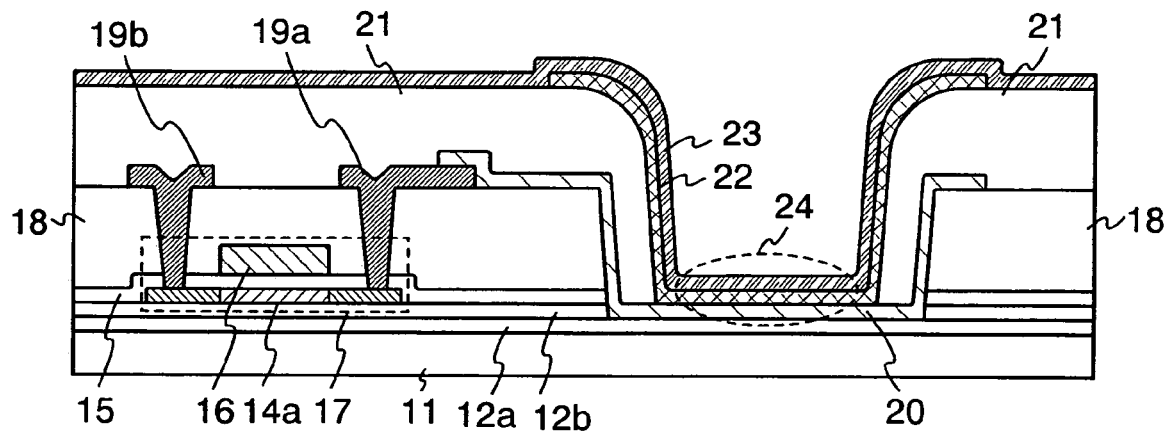
FIG. 5 is a view illustrating a structure of a light emitting device according to certain aspect of the present invention.

In addition, it is not always necessary to provide the film 19d. For example, a light emitting device in which the film 19d is not provided like a light emitting device shown in FIG. 4 is acceptable. In a light emitting device shown in FIG. 1, a semiconductor layer 14b is provided so as to surround the first electrode 20 in the same layer as a semiconductor layer 14a. However, like a light emitting device shown in FIG. 5, for example, a light emitting device having a structure without the semiconductor layer 14b surrounding the first electrode 20 is acceptable.

Note that a structure of the transistor 17 is not particularly limited. The transistor 17 may be a single gate type or a multi-gate type. In addition, the transistor 17 may have a single drain structure, an LDD (Lightly Doped Drain) structure or a structure in which an LDD region and a gate electrode are overlapped with each other.

Figure 2:
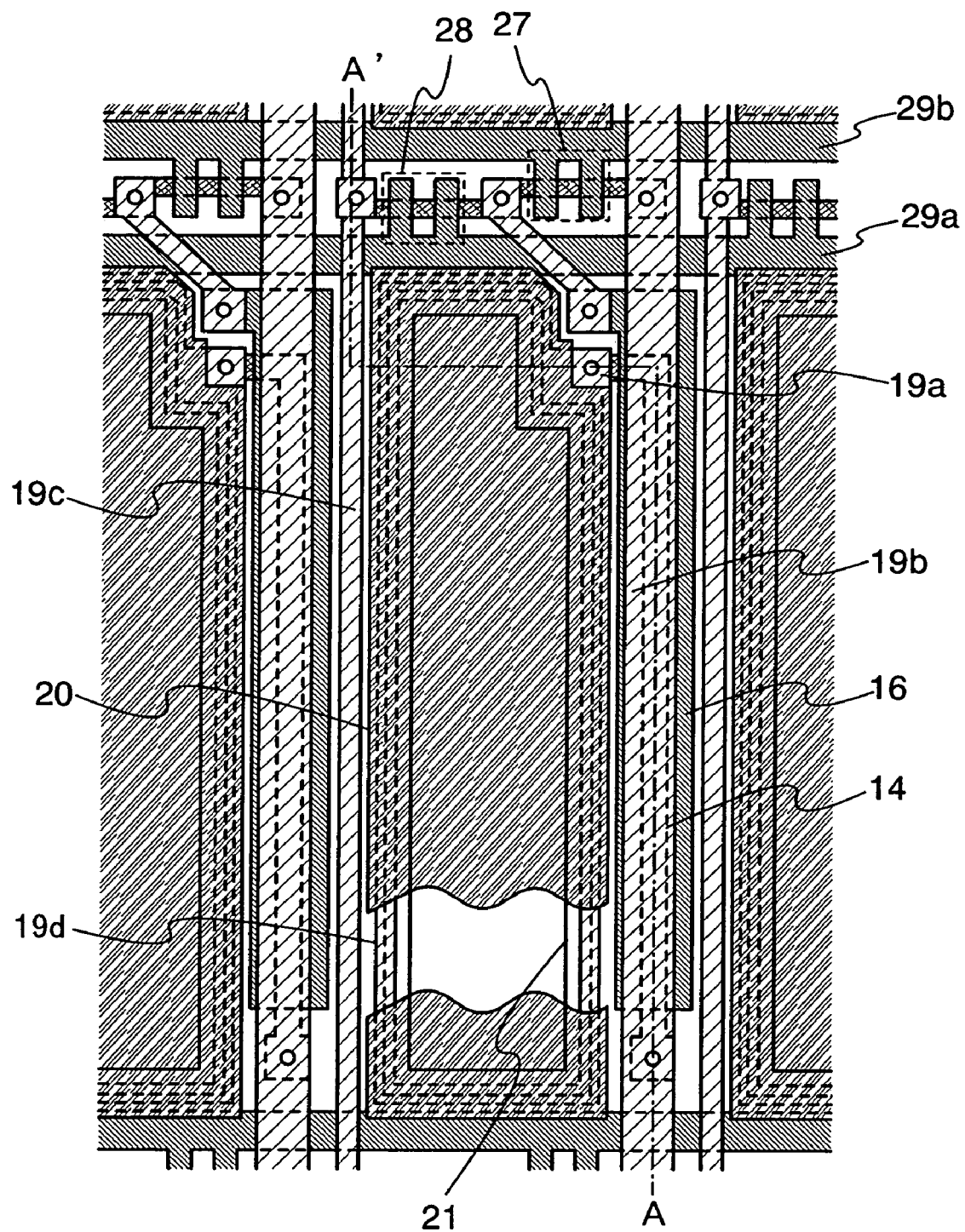
FIG. 2 is a view illustrating a structure of a light emitting device according to certain aspect of the present invention.

In addition, FIG. 2 is a top view of a light emitting device according to the present invention. Note that in FIG. 2, a part of the cross section taken along a dotted line A-A' is shown in a cross-sectional view of FIG. 1. Therefore, as for the parts corresponding to those shown in FIG. 1, the same reference numerals are used as those used in FIG. 1. That is, reference numeral 14 denotes a semiconductor layer; 16, a gate electrode; 19b, a wiring; and 19a, a connecting portion. Additionally, reference numeral 20 denotes a first electrode; and 21, a bank layer. Further, although not shown in FIG. 1, reference numerals 19c, 29a and 29b denote wirings; and 27 and 28, transistors.

In the aforementioned light emitting device, luminescence out of the light emitting element 24 is emitted outside through the first electrode 20, the insulating layer 12 and the substrate 11.

In a light emitting device according to the invention described above, the number of layers through which luminescence passes are reduced when luminescence out of a light emitting element is extracted outside. Thus, in an interface between layers, the number of time that the luminescence out of the light emitting element reflects and the amount of the reflection are reduced. As a result, multiple interference due to reflected light is controlled.

As described above, a light emitting device according to the invention has such a structure enabling control of multiple interference, and a light emitting device with preferable visibility in which variations in an emission spectrum depending on a viewing angle with respect to a side from which luminescence is extracted are decreased.

Embodiment Mode 2

A method for manufacturing a light emitting device according to the present invention shown in FIGS. 1 and 2 is described with reference to FIGS. 6 and 7.

After laminating insulating layers 12a and 12b over a substrate 11 sequentially, a semiconductor layer is further laminated on the insulating layer 12b.

Next, the semiconductor layer is processed in a desired shape to form semiconductor layers 14a and 14b. As for the processing, the semiconductor layer 14 is etched by using a resist mask.

Next, a gate insulating layer 15 covering the semiconductor layers 14a and 14b and the insulating layer 12b and the like is formed, and a conductive layer is further laminated on the gate insulating layer 15.

Next, the conductive layer is processed in a desired shape, and a gate electrode 16 is formed. Here, wirings 29a and 29b (FIG. 2) are formed along with the gate electrode 16, too. Note that the processing may be performed by etching the conductive layer by using a resist mask.

Next, an impurity at high concentration is introduced to the semiconductor layer 14a by using the gate electrode 16 as a mask. Hereby, a transistor 17 including the semiconductor layer 14a, the gate insulating layer 15 and the gate electrode 16 is formed.

In addition, manufacturing steps of the transistor 17 may be suitably changed so that a transistor of a desired structure can be manufactured without particular limitation.

Figure 6A:
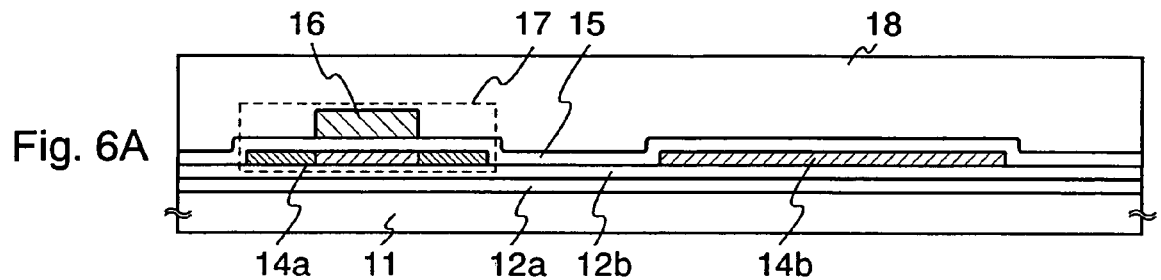
FIGS. 6A to 6E are views illustrating a method for manufacturing a light emitting device according to certain aspect of the present invention.
Figure 7A:
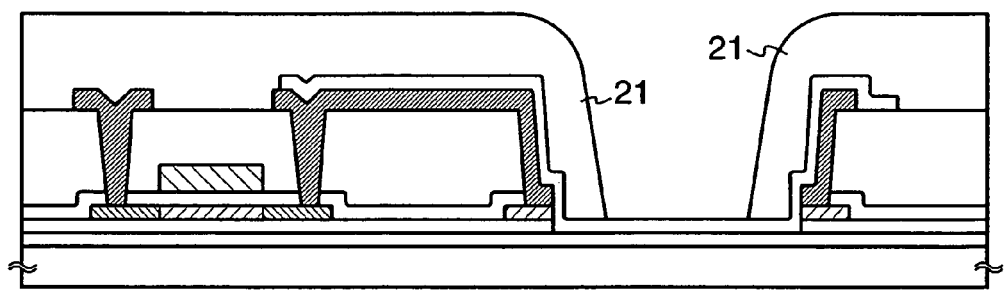
FIGS. 7A and 7B are views illustrating a method for manufacturing a light emitting device according to certain aspect of the present invention.
Figure 7B:
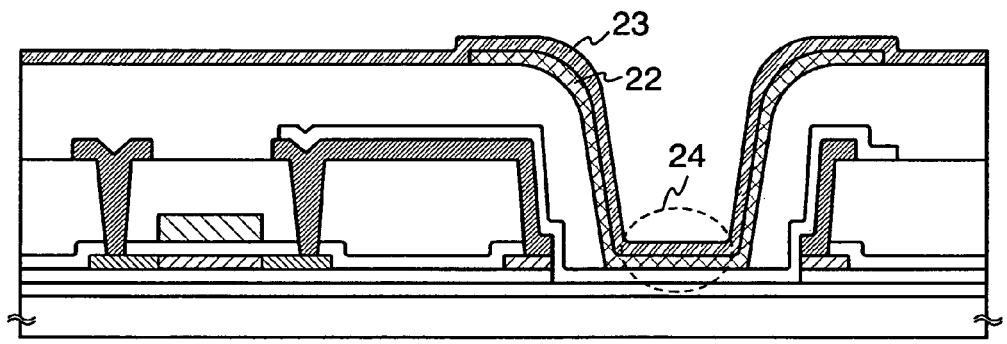

Next, an insulating layer 18 covering the gate electrode 16, the wirings 29a and 29b, the gate insulating layer 15 and the like is formed. In this embodiment, the insulating layer 18 is formed by using an inorganic material having self-planarity such as siloxane. Note that the insulating layer 18 may be also formed by using an organic material having self-planarity without being limited to the above. In addition, the insulating layer 18 does not necessary include a substance having self-planarity, and it may only include the substance which does not have self-planarity. Further, the insulating layer 18 may be a layer of the multilayer structure in which a layer including the substance having self-planarity and a layer including the substance which dose not have self-planarity are laminated. (FIG. 6A).

Figure 6B:
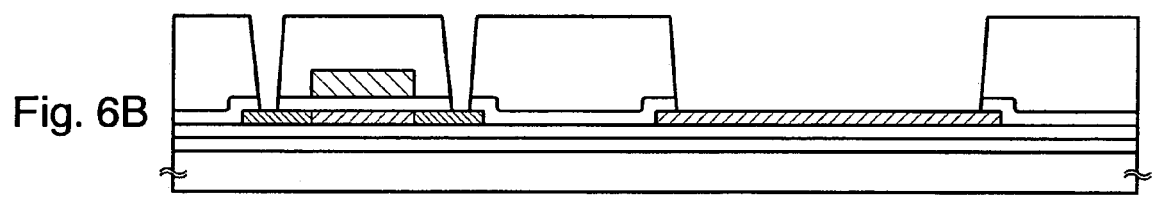
Figure 6C:
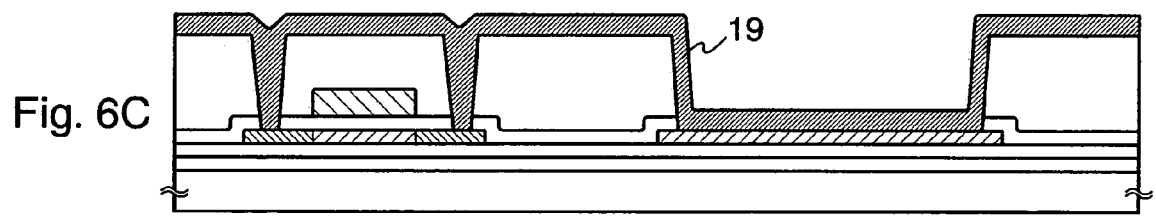
Figure 6D:
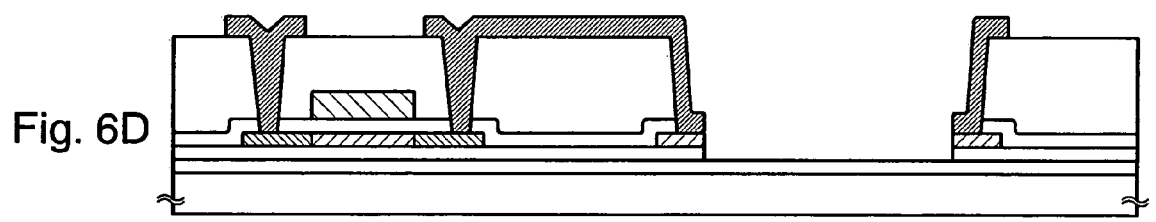
Figure 6E:
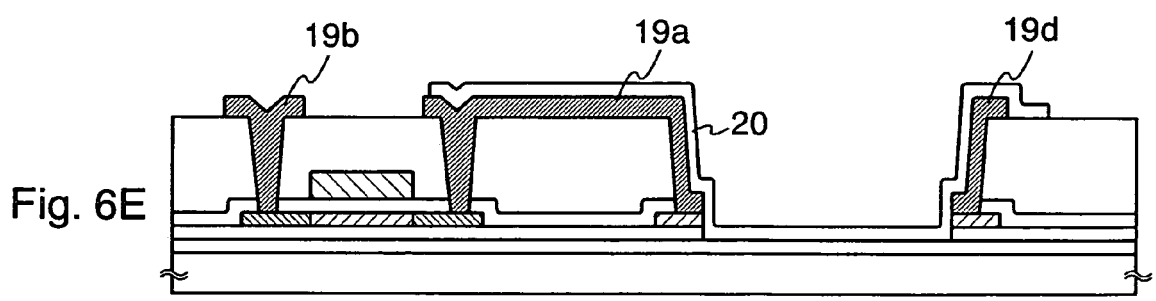

Next, a contact hole penetrating the insulating layer 18 to reach the semiconductor layer 14a and a first opening reaching the semiconductor layer 14b are formed. (FIG. 6B).

Next, after forming a conductive layer 19 covering the insulating layer 18 and the like (FIG. 6C), the conductive layer 19 is processed in a desired shape to form a connecting portion 19a, wirings 19b and 19c, a film 19d and the like. (FIG. 6D) At this time, in the first opening, the semiconductor layer 14b and the insulating layer 12b are partially removed by etching so that the insulating layer 12a is exposed. In this embodiment, the semiconductor layer 14b is used as a layer to regulate etching rate. Thus, it is not necessary to provide the semiconductor layer 14b particularly like a light emitting device shown in FIG. 5 as long as etching rate can be regulated without the semiconductor layer 14b.

Next, after a light-transmitting conductive layer is formed so as to cover the connecting portion 19a and the like, the conductive layer is processed to form a first electrode 20. (FIG. 6E) At this time, the first electrode 20 is processed so as to contact partially with the connecting portion 19a and may be processed in a shape covering an opening provided in the insulating layer 18.

Next, a bank layer 21 having an opening so as to expose a part of the first electrode 20 is formed, which covers the connecting portion 19a, the insulating layer 18 and the like. (FIG. 7A) Here, the bank layer 21 may be formed by processing a photosensitive resin material in a desired shape through exposure and development. Alternatively, after a non-photosensitive layer including an inorganic material or an organic material is formed, it may be formed by processing the layer in a desired shape through etching.

Next, a light emitting layer 22 covering the first electrode 20 exposed from the bank layer 21 is formed. Any of vapor deposition, ink-jet, spin coating or the like may be used for forming the light emitting layer 22. In addition, when a depression or a projection is formed on the insulating layer 12a, the depression or the projection can be relieved by providing a layer containing a high molecular weight material such as PEDOT in a part of the light emitting layer 22.

Then, a second electrode 23 covering the light emitting layer 22 is formed. (FIG. 7B) Hereby, a light emitting element 24 including the first electrode 20, the light emitting layer 22 and the second electrode 23 can be manufactured.

As described above, a light emitting device according to the invention as shown in FIG. 1 can be manufactured.

EMBODIMENTS

Embodiment 1

This embodiment describes experimental results of an examination where advantageous effect according to the present invention is investigated.

Figure 8A:
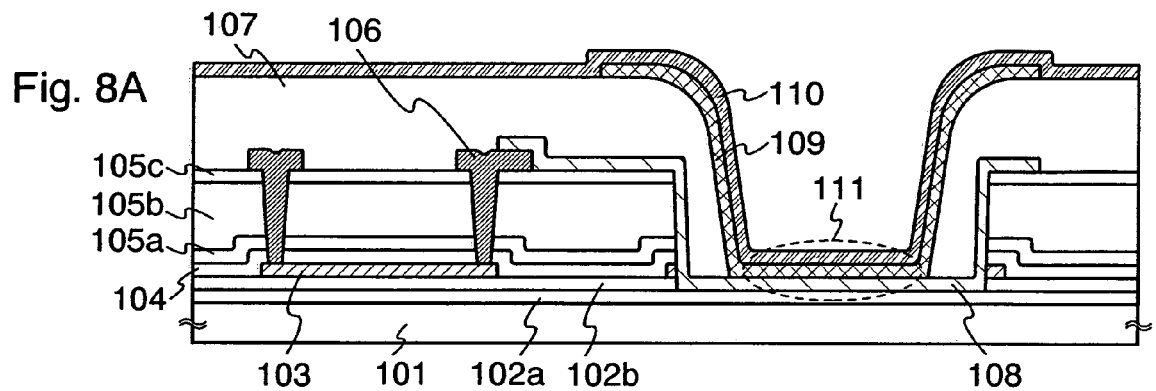
FIGS. 8A and 8B are views illustrating a structure of a sample used in an experiment to examine validity according certain aspect of to the present invention.
Figure 8B:
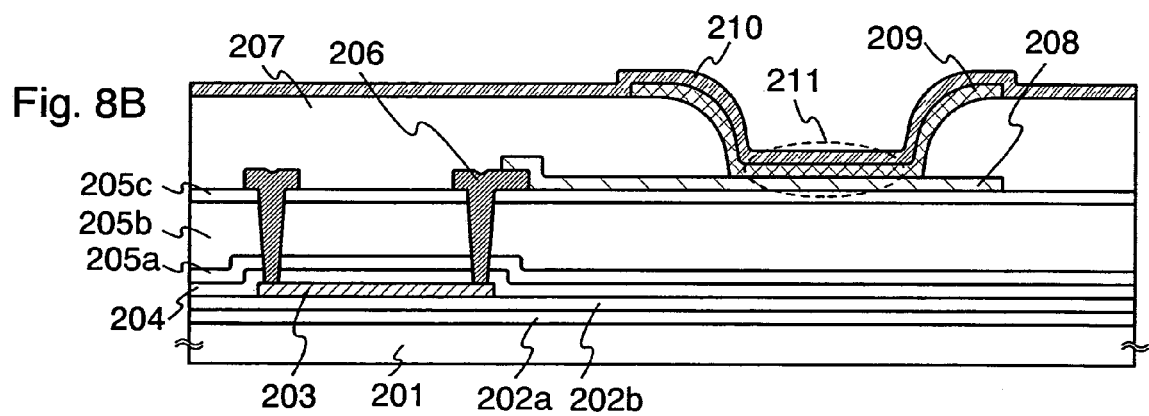

FIG. 8A shows a structure of a light emitting device to which the invention is applied. FIG. 8B shows a structure of a light emitting device as a comparative example.

It is an object of this embodiment to compare specifically structures with respect to of a part from which luminescence is extracted. Therefore, a light emitting device manufactured through a simplified manufacturing steps without being provided with a transistor for driving a light emitting element are evaluated.

In FIG. 8A, insulating layers 102a and 102b are provided such that they are sequentially laminated over a glass substrate 101. Note that the insulating layer 102a includes silicon nitride containing oxygen, and the insulating layer 102b includes silicon oxide.

A semiconductor layer 103 including silicon is provided on the insulating layer 102b. In addition, an insulating layer 104 including silicon oxide is provided so as to cover the semiconductor layer 103.

Further, insulating layers 105a, 105b and 105c, which are sequentially laminated, are provided over the insulating layer 104. Moreover, the insulating layer 104 is in contact with the insulating layer 105a. Here, the insulating layer 105a includes silicon nitride containing oxygen; the insulating layer 105b, siloxane; and the insulating layer 105c, silicon nitride.

In addition, a wiring 106 is provided over the insulating layers 105a to 105c. The wiring 106 is connected to the semiconductor layer 103 through a contact hole which penetrates the insulating layers 105a to 105c to reach the semiconductor layer 103. Further, the wiring 106 is in contact with a first electrode 108 which is a component of a light emitting element 111.

Moreover, a first opening is provided in the insulating layers 105a to 105c so that the insulating layer 102a is exposed. Then, the first electrode 108 is provided so as to cover the first opening. In other words, the insulating layer 102a is in contact with the first electrode 108. Further, a bank layer 107 having a second opening is provided so as to cover the wiring 106 and expose a part of the first electrode 108. Note that the first electrode 108 includes ITO containing silicon oxide, and the bank layer 107 includes photosensitive polyimide.

In the second opening, a light emitting layer 109 is provided over the first electrode 108, and a second electrode 110 is further provided over the light emitting layer 109. As thus described, the part in which the first electrode 108, the light emitting layer 109 and the second electrode 110 are laminated functions as a light emitting element 111.

In a light emitting device shown in FIG. 8A, luminescence is emitted to the outside of the light emitting device through the first electrode 108, the insulating layer 102a and the substrate 101.

In addition, the semiconductor layer 103 corresponds to a semiconductor layer included in a transistor, and the insulating layer 104 corresponds to a gate insulating film included in a transistor. Thus, the part in which the light emitting element 111 is provided has the similar laminated structure to that of a light emitting device according to the invention.

In FIG. 8B, such an opening shown in FIG. 8A is not provided in an insulating layer 205, and a light emitting element 211 is provided over the insulating layer 205. The other configurations are similar to those shown in FIG. 8A. Note that reference numeral 201 denotes a substrate; 202a and 202b, insulating layers; 203, a semiconductor layer; 204, 205a, 205b and 205c, insulating layers; 206, a wiring; 207, a bank layer; 208, a first electrode; 209, a light emitting layer; and 210, a second electrode. In addition, each of the above includes the same substance as that of a light emitting device shown in FIG. 8A.

As for a light emitting device having such a structure shown in FIG. 8A, light emitting devices exhibits red emission, green emission and blue emission are manufactured respectively. In addition, as for a light emitting device having such a structure shown in FIG. 8B, light emitting devices exhibits red emission, green emission and blue emission are also manufactured respectively.

Figure 9A:
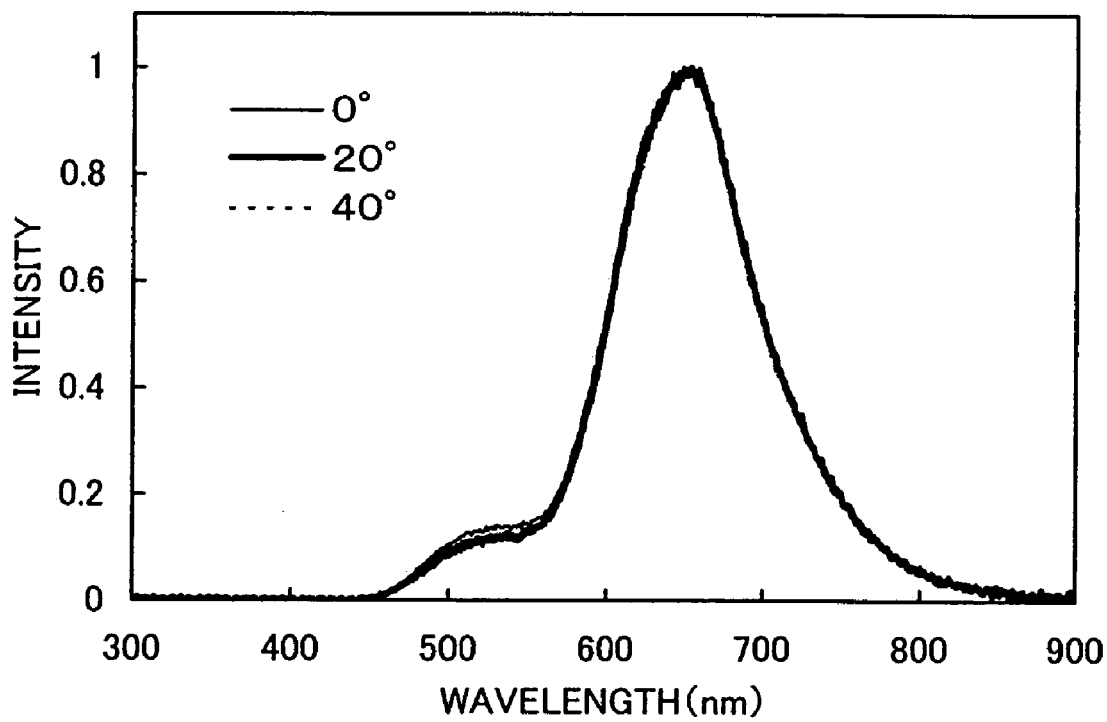
FIGS. 9A and 9B are graphs showing emission spectrum properties of a sample used in an experiment to examine validity according to certain aspect of the present invention.
Figure 9B:
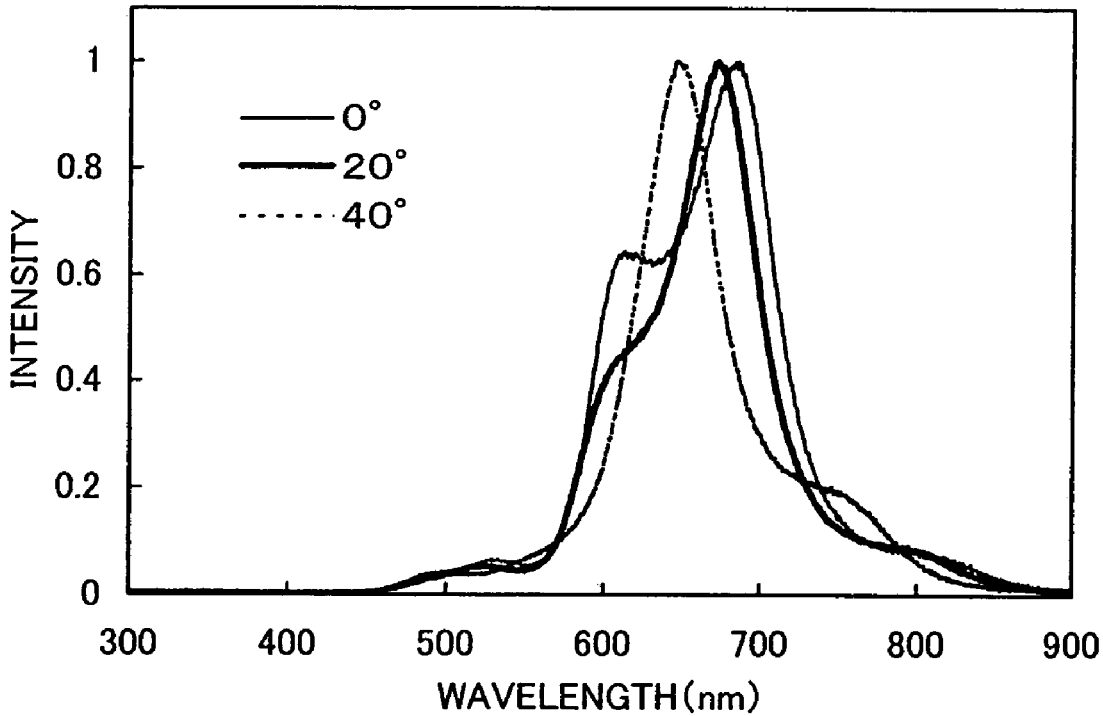
Figure 10A:
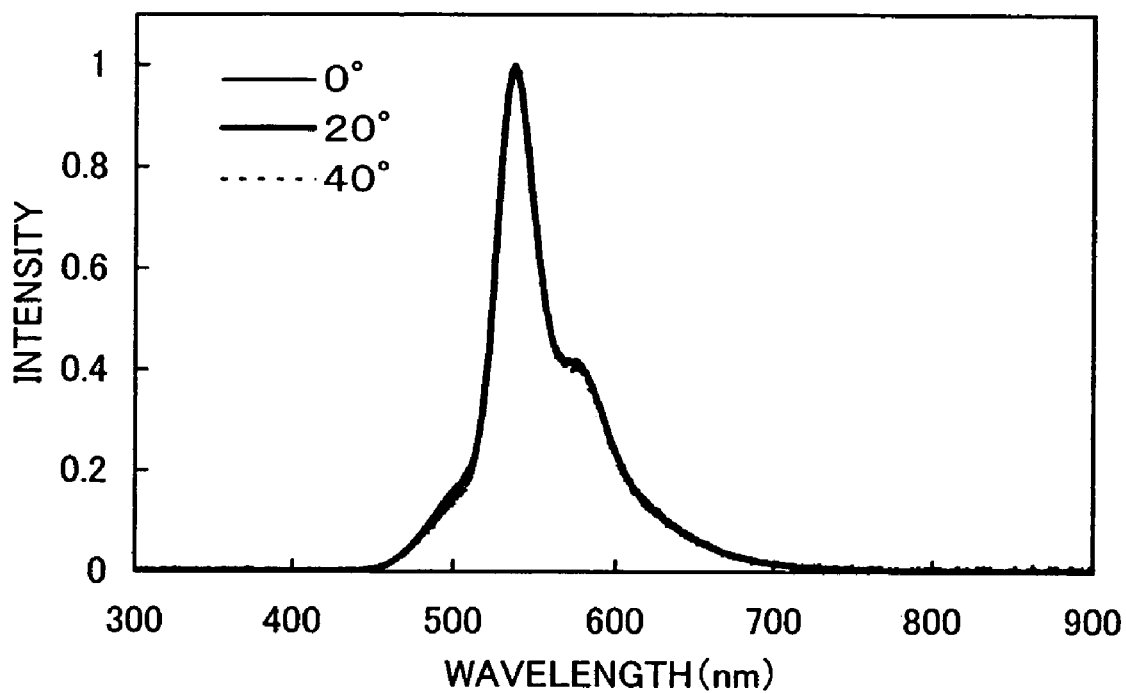
FIGS. 10A and 10B are graphs showing emission spectrum properties of a sample used in an experiment to examine validity according to certain aspect of the present invention.
Figure 10B:
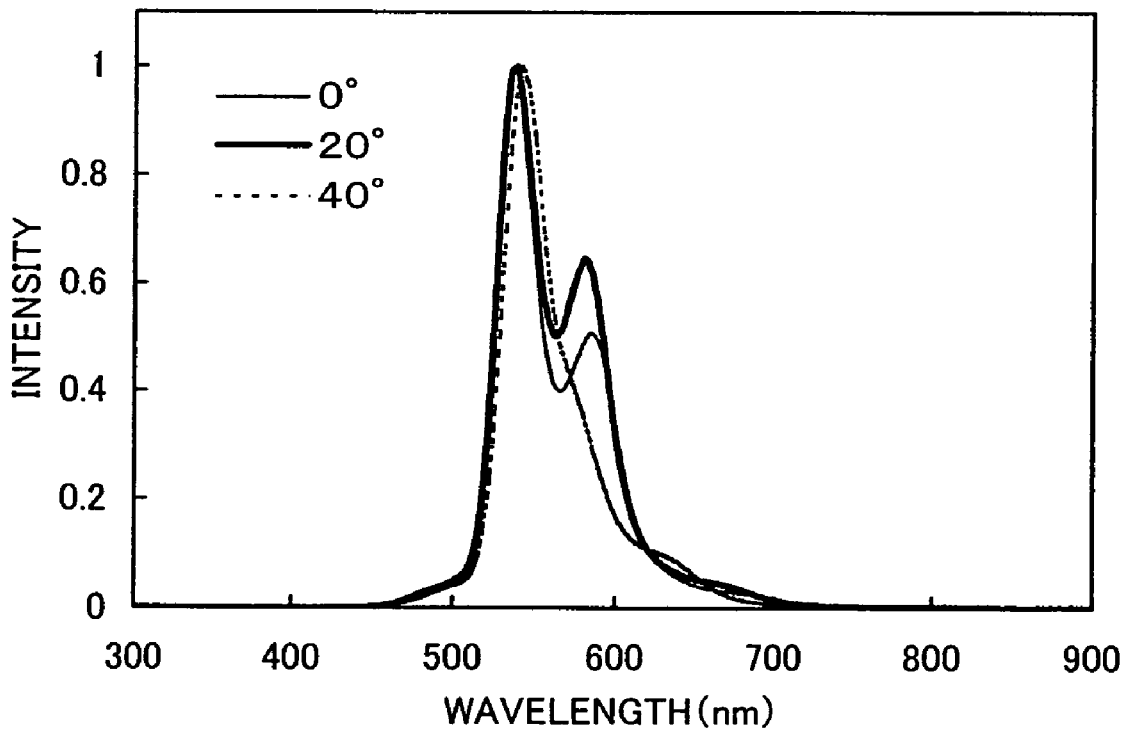
Figure 11A:
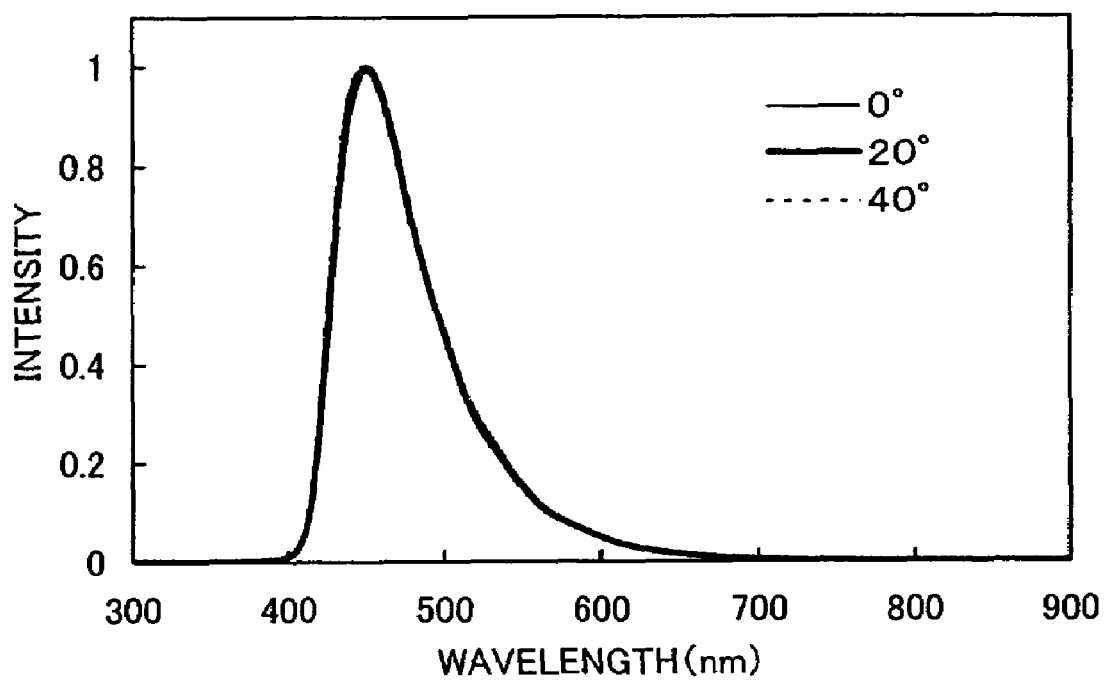
FIGS. 11A and 11B are graphs showing emission spectrum properties of a sample used in an experiment to examine validity according to certain aspect of the present invention.
Figure 11B:
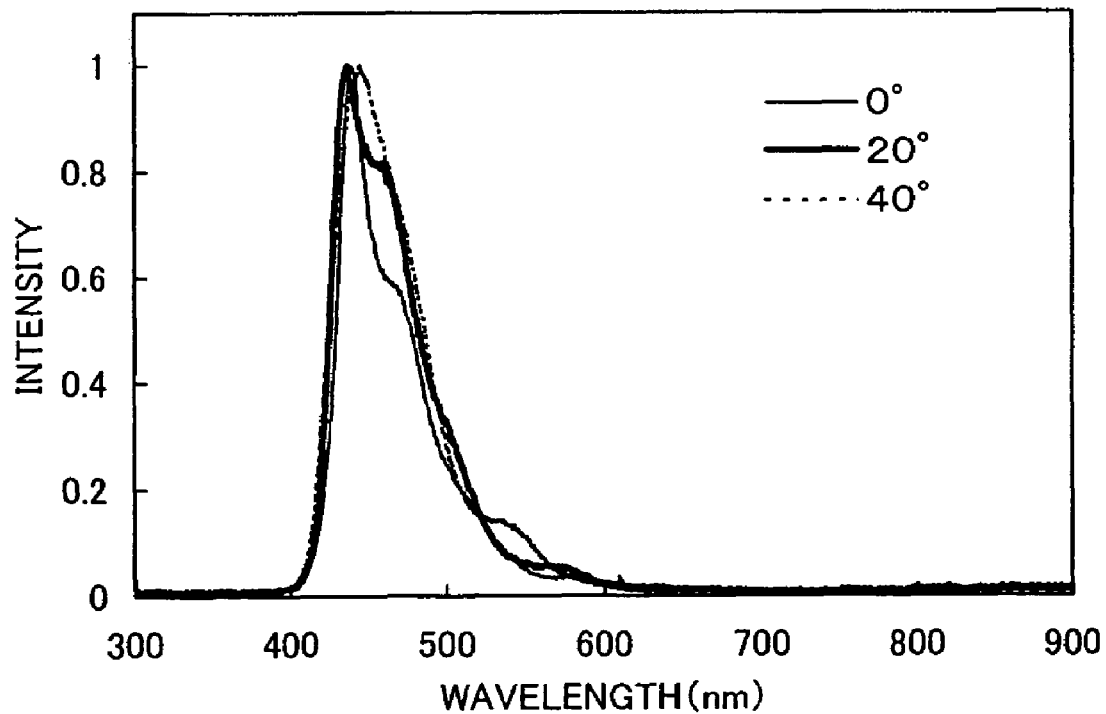

FIGS. 9A, 10A, 11A are graphs illustrating the measurement results obtained when an emission spectrum of luminescence out of a light emitting device having the structure as shown in FIG. 8A is measured with an emission spectrum analysis device. In addition, FIGS. 9B, 10B, 11B are graphs showing the measurement results obtained when an emission spectrum of luminescence out of a light emitting device having the structure as shown in FIG. 8B is measured with an emission spectrum analysis device. In FIGS. 9A, 9B, 10A, 10B, 11A and 11B, a horizontal axis represents spectrum (nm), and a vertical axis represents emission intensity. In addition, the cases in which an emission spectrum is measured from a direction tilted at 0 degree to the normal line direction of a substrate (a side from which luminescence is extracted), the case in which an emission spectrum is measured from a direction tilted at 20 degree to the normal line direction of a substrate (a side from which luminescence is extracted), and the case in which an emission spectrum is measured from a direction tilted at 40 degree to the normal line direction of a substrate (a side from which luminescence is extracted) are shown respectively.

FIGS. 9A and 9B are graphs illustrating the measurement results of luminescence out of a light emitting device containing 4-(dicyanomethylene)-2, 6-bis[p-(dimethylamino) styryl]-4H-pyran in a light emitting layer and exhibiting red emission. FIGS. 10A and 10B are graphs illustrating the measurement results of luminescence out of a light emitting device containing N,N'-dimethylquinacridone in a light emitting layer, and exhibiting green emission. FIGS. 11A and 11B are graphs illustrating the measurement results of luminescence out of a light emitting device containing 2-tertbutyl-9, 10-di(2-naphthyl)anthracene in a light emitting layer and exhibiting blue emission.

Referring to FIG. 9A, a light emitting device to which the invention is applied obtains emission spectrums of red emission having a similar shape at any measuring angle. On the other hand, referring to FIG. 9B, a light emitting device of the comparative example has different emission spectrums depending on angles at which luminescence is measured.

Referring to FIG. 10A, a light emitting device to which the invention applied obtains emission spectrums of green emission having a similar shape at any measuring angle. On the other hand, referring to FIG. 10B, a light emitting device of the comparative example has different emission spectrums depending on angles at which luminescence is measured.

Referring to FIG. 11A, a light emitting device to which the invention is applied obtains emission spectrums of blue emission having a similar shape at any measuring angle. On the other hand, referring to FIG. 11B, a light emitting device of the comparative example has different emission spectrums depending on angles at which luminescence is measured.

As described above, it is able to obtain a light emitting device in which the variations in any emission spectrum of red emission, green emission and blue emission depending on a viewing angle with respect to a side from which luminescence is extracted are reduced by applying the invention.

Embodiment 2

This embodiment describes a light emitting device to which the present invention is applied. Note that a structure of a light emitting device according to the invention, substances configuring the light emitting device and the like are not limited to a light emitting device described in this embodiment.

A light emitting device of this embodiment is a light emitting device according to the invention shown in FIG. 1.

In this embodiment, a light emitting layer 22 which is a component of a light emitting element 24 is formed of a plurality of layers. The plurality of layers is formed by laminating layers each of which include either a substance having high carrier transporting properties or a substance having high carrier injecting properties. Additionally, a part of the plurality of layers includes a substance having high luminescence properties. Note that 4-dicyanomethylene-2-methyl-6-(1,1,7,7-tetramethyljulolidyl-9-enyl)-4H-pyran (abbrethroughtion: DCJT), 4-dicyanomethylene-2-t-butyl-6-(1,1,7,7-tetramethyljulolidyl-9-enyl)-4H-pyran (abbrethroughtion: DPA), periflanthen, 2,5-dicyano-1,4-bis(10-methoxy-1,1,7,7-tetramethyljulolidyl-9-enyl)benzene, N,N'-dimethylquinacridone (abbrethroughtion: DMQd), coumarin 6, coumarin 545T, tris(8-quinolinolate)aluminum (abbrethroughtion: $Alq_3$), 9,9'-bianthryl, 9,10-diphenylanthracene (abbrethroughtion: DPA) and 9,10-bis(2-naphthyl)anthracene (abbrethroughtion: DNA) or the like can be used for a light emitting substance. In addition, other substances may be used for the light emitting substance. Among substances having high electron transporting properties, for example, a metal complex having a quinoline skeleton or a benzoquinoline skeleton is cited as a substance having particularly high carrier transporting properties: tris(8-quinolinolate)aluminum (abbrethroughtion: $Alq_3$), tris(5-methyl-8-quinolinolate)aluminum (abbrethroughtion: $Almq_3$), bis(10-hydroxybenzo [h]-quinolinato)beryllium (abbrethroughtion: $BeBq_2$), bis(2-methyl-8-quinolinolate)-4-phenylphenolate-aluminum (abbrethroughtion: BAlq) or the like. Further, as an example, a compound of aromatic amine system (namely, having bond of benzene ring-nitrogen) is cited as a substance having high hole transporting properties: 4,4'-bis[N-(1-naphthyl)-N-phenyl-amino]-biphenyl (abbrethroughtion: α-NPD), 4,4'-bis[N-(3-methylphenyl)-N-phenyl-amino]-biphenyl (abbrethroughtion: TPD), 4,4',4''-tris(N,N-diphenyl-amino)-triphenylamine (abbrethroughtion: TDATA), 4,4',4''-tris[N-(3-methylphenyl)-N-phenyl-amino]-triphenylamine (abbrethroughtion: MTDATA) or the like. Among substances of high carrier injecting properties, for example, alkali metal or a compound of alkali earth metal is cited as a substance having particularly high electron injecting properties: a compound of lithium fluoride (LiF), cesium fluoride (CsF), calcium fluoride ($CaF_2$) or the like. Besides, a mixture of a substance having high carrier transporting properties such as $Alq_3$ with alkaline earth metal such as magnesium (Mg) may be cited as a substance having particularly high electron transporting properties. For example, as a substance having high hole injecting properties, metal oxide such as molybdenum oxide (MoOx), vanadium oxide (VOx), ruthenium oxide (RuOx), tungsten oxide (WOx), manganese oxide (MnOx) is cited. Besides, a compound of phthalocyanine system such as phthalocyanine (abbrethroughtion: $H_2Pc$) or copper phthalocyanine (CuPC) is cited as the substance having particularly high hole injecting properties.

A transistor 17 is a staggered type, but may be an inverted staggered type. When the transistor 17 is a inverted staggered type, it may be a so-called channel protective type in which a protective layer is formed on a semiconductor layer, or a so-called channel etch type in which the semiconductor layer is partially etched.

A semiconductor layers 14*a* and 14*b* may be either a crystalline layer or a non-crystalline layer. In addition, the semiconductor layers 14*a* and 14*b* may be semi-amorphous layers or the like.

The semi-amorphous semiconductor is described as follows. The semi-amorphous semiconductor has an intermediate structure between a non-crystalline structure and a crystalline structure (including a single crystalline and polycrystalline structure), and has a tertiary state which is stable in a view of free energy, including a crystalline region having a grain diameter of short-distance order and lattice distortion. In addition, at least some region of the film includes a crystal grain of from 0.5 nm to 20 nm. The Raman spectrum shifts to the wave number side lower than 520 cm$^{-1}$. Diffraction peaks of (111) and (220) derived from Si crystalline lattice are observed in X-ray diffraction. Hydrogen or halogen is included at least 1 atomic % or more as a neutralizer for an uncombined hand (dangling bond). The semi-amorphous semiconductor is also referred to as a so-called microcrystal semiconductor. It is formed by performing grow discharging decomposition (plasma CVD) of a silicide gas. For the silicide gas, it is possible to use $SiH_4$, additionally, $Si_2H_6$, $SiH_2Cl_2$, $SiHCl_3$, $SiCl_4$, $SiF_4$ or the like. This silicide gas may be diluted with $H_2$, or $H_2$ and one or a more kinds of rare gas elements: He, Ar, Kr and Ne. Dilution ratio is in a range from 2 times to 1000 times. Pressure is in a range from 0.1 Pa to 133 Pa, power frequency is from 1 MHz to 120 MHz, preferably, from 13 MHz to 60 MHz. Substrate heating temperature may be 300° C. or less, preferably, from 100° C. to 250° C. As for an impurity element in a film, it is preferable that impurities of atmospheric component such as oxygen, nitrogen, carbon are preferably set $1\times10^{20}$ atoms/cm$^3$ or less, in particular, the oxygen concentration is set $5\times10^{19}$ atoms/cm$^3$ or less, preferably, $1\times10^{19}$ atoms/cm$^3$ or less. Note that mobility of a TFT (a thin film transistor) having a semi-amorphous semiconductor layer is about 1 m$^2$/Vsec to 10 m$^2$/Vsec.

As a specific example of the crystalline semiconductor layer, the layer including single crystalline silicon, polycrystalline silicon, silicon germanium or the like is cited. These layers may be formed by laser crystallization, or may be also formed by using a solid phase growth method in which nickel or the like is used for example.

When the semiconductor layer includes an amorphous substance such as amorphous silicon for example, it is preferable that all of the transistor 11 and the other transistors (the transistor configuring a circuit for driving a light emitting element) are a light emitting device having a circuit configured by an n-channel transistor. As for the other cases, the transistor 11 and the other transistors may be a light emitting device having a circuit configured by either an n-channel type transistor or a p-channel type transistor, or may be the light emitting device having a circuit configured by both the transistors.

It is preferable that a bank layer 21 has a shape in which a radius of curvature varies continuously in an edge as shown in FIG. 1. Additionally, the bank layer 21 is formed by using acryl, siloxane (a substance in which a skeletal structure is formed by a bond of silicon (Si) and oxygen (O), and which contains at least hydrogen as a substituent), resist, silicon oxide or the like. Note that the bank layer 21 may be formed of either an inorganic film or an organic film, or may be formed by using the both.

Figure 12A:
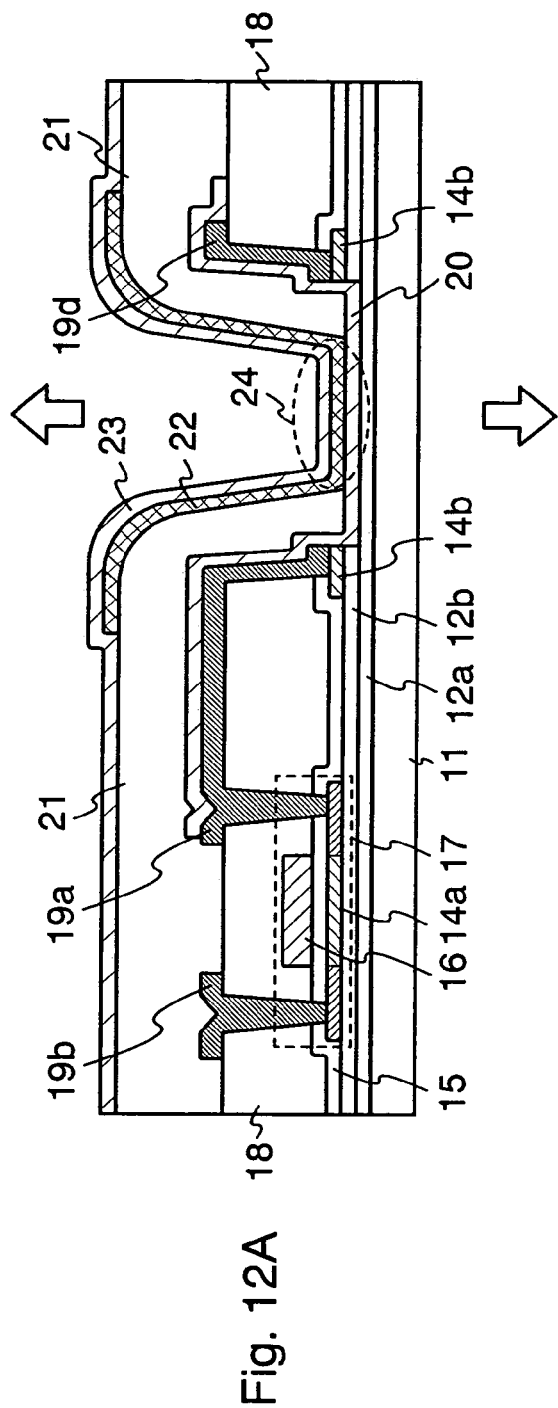
FIGS. 12A and 12B are views illustrating a light emitting device according to certain aspect of the present invention.
Figure 12B:
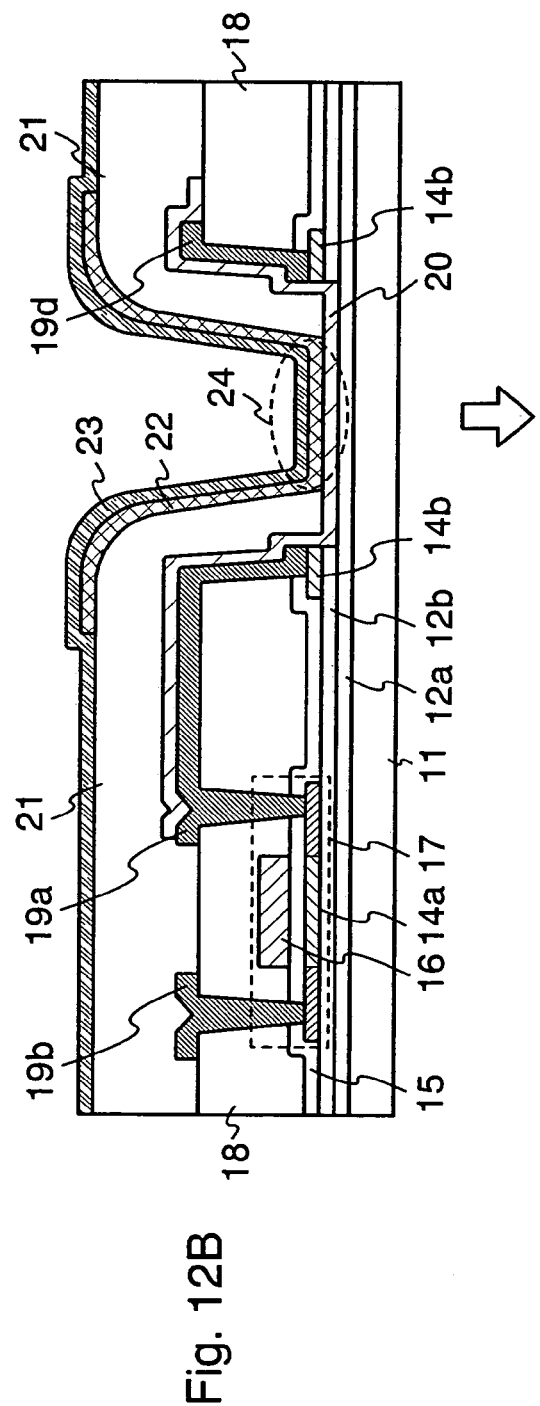

In the light emitting element 24, when both a first electrode 20 and a second electrode 23 include a substance having light-transmitting properties such as indium tin oxide (ITO), luminescence can be extracted from both the first electrode 20 side and the second electrode 23 side as indicated with an outline arrow in FIG. 12A. Alternatively, when only the first electrode 20 includes a substance having light-transmitting properties, luminescence can be extracted only from the first electrode 20 side as indicated with an outline arrow in FIG. 12B. In this case, it is preferable that the second electrode 23 includes a material of high reflectivity or, a film including a material of high reflectivity (a reflection coating) is provided over the second electrode 23.

In addition, the light emitting element 24 may have a configuration in which the first electrode 20 functions as an anode and the second electrode 23 functions as a cathode, or a configuration in which the first electrode 20 functions as a cathode and the second electrode 23 functions as an anode. Note that the transistor 17 is a p-channel type transistor in the former case, and the transistor 17 is an n-channel type transistor in the latter case.

In a light emitting device according to the invention as described above, variations in an emission spectrum depending on a viewing angle with respect to a side from which luminescence is extracted are decreased.

Embodiment 3

This embodiment describes a circuit provided in a pixel portion in order to drive a light emitting element in a light emitting device according to the present invention. Note that the circuit for driving a light emitting device is not limited to a circuit described in this embodiment.

Figure 13:
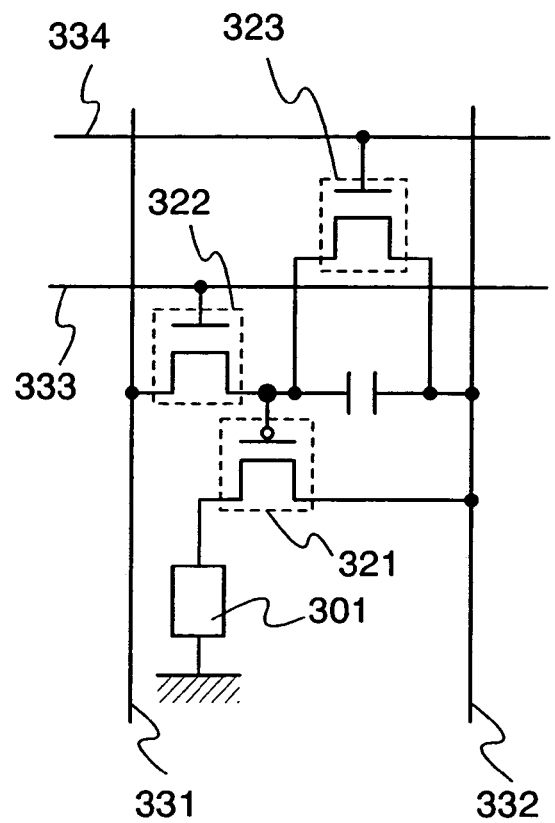
FIG. 13 is a diagram illustrating a circuit for driving a light emitting device according to certain aspect of the present invention.

As shown in FIG. 13, a circuit for driving each light emitting element is connected to a light emitting element 301. The circuit has a driving transistor 321 which determines emission state/non-emission state of the light emitting device 301 according to a video signal, a switching transistor 322 which controls an input of the video signal and a erasing transistor 323 which sets the light emitting element 301 a non-emission state regardless of the video signal. Here, the source (or the drain) of the switching transistor 322 is connected to a source signal line 331, the sources of the driving transistor 321 and the erasing transistor 323 are connected to a current supply line 332 extending parallel to the source signal line 331, the gate of the switching transistor 322 is connected to a first scan line 333, and the gate of the erasing transistor 323 is connected to a second scan line 334 extending parallel to the first scan line 333. In addition, the driving transistor 321 is serially connected to the light emitting element 301.

A driving method when the light emitting device 301 emits light is described. When the first scan line 333 is selected in a writing period, the switching transistor 322 with the gate connected to the first scan line 333 is turned on. Then, a video signal inputted to the source signal line 331 is inputted to the gate of the driving transistor 321 through the switching transistor 322. Accordingly, a current flows from the current supply line 332 to the light emitting element 302, and green light is emitted. At this time, luminance of the luminescence depends on the amount of the current flowing to the light emitting element 302.

Note that the light emitting element 301 corresponds to a light emitting element 24 in FIG. 1; and the driving transistor 321, a transistor 17 in FIG. 1. In addition, the erasing transistor 323 corresponds to a transistor 27 in FIG. 2; and the switching transistor 322, a transistor 28 in FIG. 2. Further, the source signal line 331 corresponds to a wiring 19c in FIG. 2; the current supply line 332, a wiring 19b in FIG. 2; the first scan line 333, a wiring 29a in FIG. 2; and the second scan line 334, a wiring 29b in FIG. 2.

Figure 14:
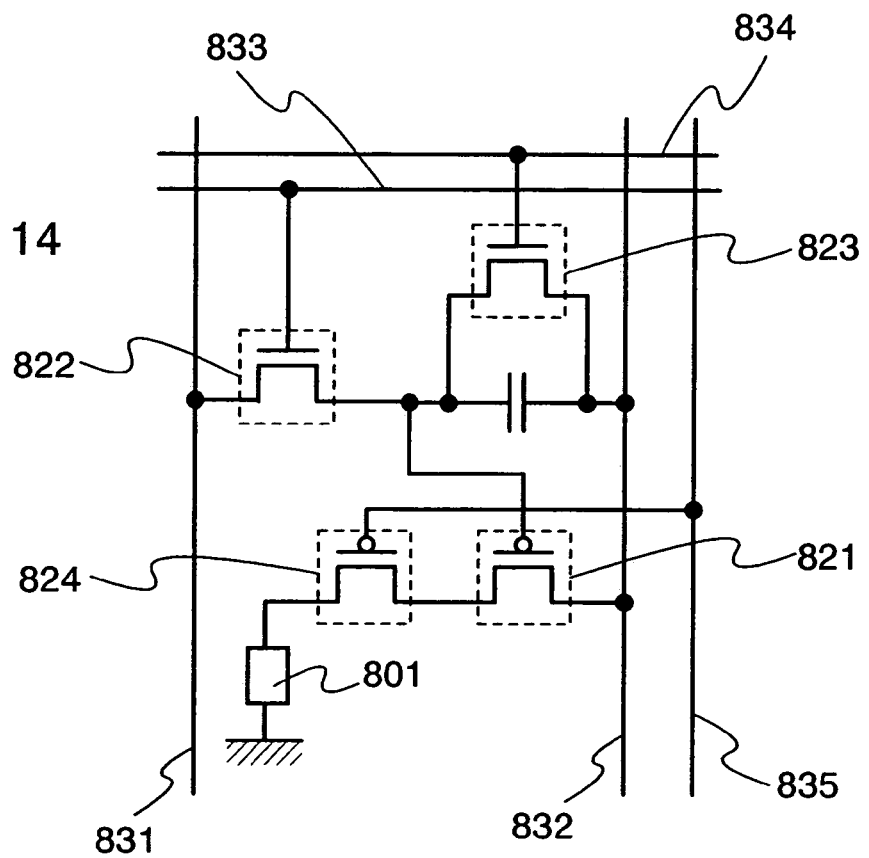
FIG. 14 is a diagram illustrating a circuit for driving a light emitting device according to certain aspect of the present invention.

A configuration of a circuit connected to each light emitting element may be different from the above as shown in FIG. 14 without being limited to the configuration described above.

Next, a circuit shown in FIG. 14 is described.

As shown in FIG. 14, a circuit for driving each light emitting element is connected to a light emitting element 801. The circuit has a driving transistor 821 which determines emission state/non-emission state of the light emitting element 801 by a video signal, a switching transistor 822 which controls an input of the video signal, an erasing transistor 823 which sets the light emitting element 801 non-emission state regardless of the video signal, and a current controlling transistor 824 which is for controlling the amount of current which is supplied to the light emitting element 801. Here, the source (or the drain) of the switching transistor 822 connects to a source signal line 831, the sources of the driving transistor 821 and the erasing transistor 823 are connected to a current supply line 832 extending parallel to the source signal line 831, the gate of the switching transistor 822 is connected to a first scan line 833, and the gate of the erasing transistor 823 is connected to a second scan line 834 extending parallel to the first scan line 833. In addition, the driving transistor 821 is serially connected to the light emitting element 801, having the current supplying transistor 824 therebetween. The gate of a current supplying transistor 822 is connected to a power supply line 835. Note that the current controlling transistor 824 is configured and controlled so that a current flows in a saturation region in voltage-current (Vd-Id) properties. Accordingly, the amount of the current flowing to the transistor 824 can be determined.

A driving method when the light emitting element 801 emits light is explained. When the first scan line 833 is selected in a writing period, the switching transistor 822 with the gate connected to the first scan line 833 is turned on. Then, a video signal inputted to the source signal line 831 is inputted to the gate of the driving transistor 821 through the switching transistor 822. Further, a current flows from the current supply line 834 to the light emitting element 802 through the driving transistor 821 and the current controlling transistor 824 which is turned on by receiving a signal from the power supply line 835. Note that the amount of current which flows to the light emitting element depends on the current controlling transistor 824.

Embodiment 4

According to the present invention, variations in an emission spectrum and emission intensity depending on a viewing angle with respect to a side from which luminescence is extracted are decreased. Accordingly, a display device and the like capable of providing an image superior in visibility can be obtained. This embodiment describes specific examples of electronic apparatus whose visibility is improved by the invention.

A light emitting device to which the invention is applied is mounted on various electronic apparatus after mounting an external input terminal and sealing the light emitting device.

This embodiment describes a light emitting device applying the invention and electronic apparatus mounting the light emitting device with reference to FIGS. 15, 16, 17A and 17B. Note that the electronic apparatus shown in FIGS. 15, 16, 17A and 17B is one embodiment, and the configuration of a light emitting device is not limited thereto.

Figure 15:
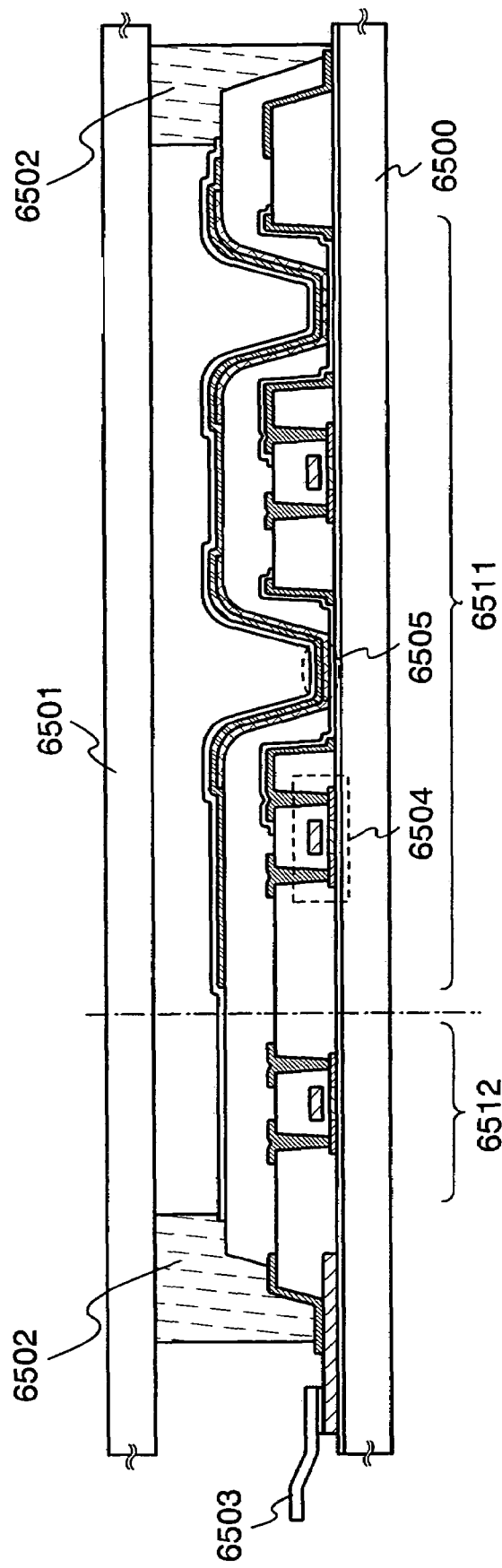
FIG. 15 is a view illustrating a light emitting device according to certain aspect of the present invention after sealing.

FIG. 15 is a cross-sectional view of a light emitting device after sealing. A substrate 6500 and a sealing substrate 6501 are sealed with a sealant 6502 so that a transistor 6504 and a light emitting element 6505 are confined. In addition, an FPC (a flexible print circuit) 6503 serving as an external input terminal is attached to the end of the substrate 6500. Note that an inner region confined by the substrate 6500 and the sealing substrate 6501 is filled with an inert gas such as nitrogen or a resin material.

Figure 16:
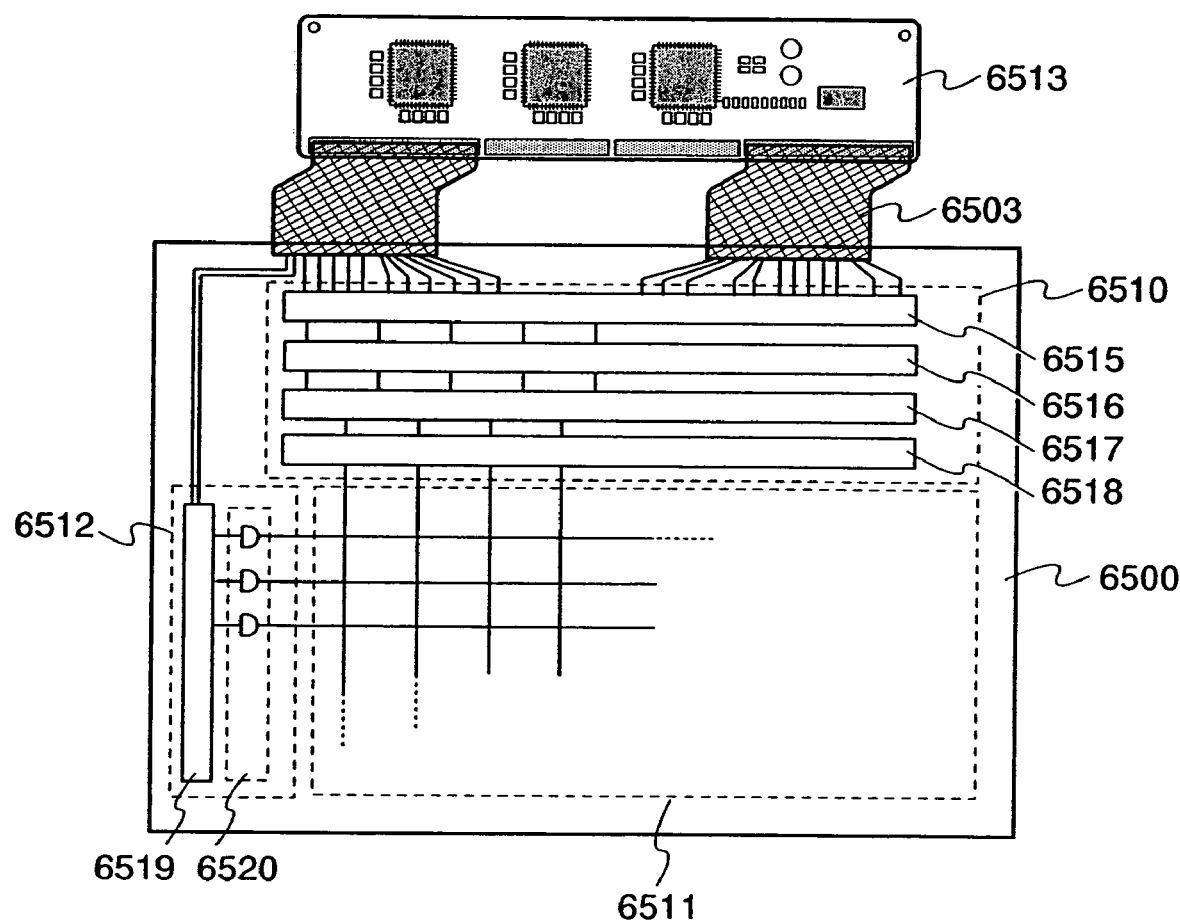
FIG. 16 is a schematic diagram illustrating a whole light emitting device according to certain aspect of the present invention.

FIG. 16 is a schematic diagram of a light emitting device to which the invention is applied, showing from the upper surface. In FIG. 16, reference numeral 6510 indicated with a dotted line denotes a driver circuit portion (a source side driver circuit); 6511, a pixel portion; and 6512, a driver circuit portion (a gate side driver circuit). The light emitting element according to the invention is provided in the pixel portion 6511. The driver circuit portion 6510 is connected to the driver circuit portion 6512 through the FPC 6503 serving as an external input terminal and wirings formed over the substrate 6500. A signal is inputted to the source side driver circuit 6510 and the gate side driver circuit 6512 by receiving a video signal, a clock signal, a start signal, a reset signal and the like from the FPC (the flexible print circuit) 6503. In addition, a printed wiring board (PWB) 6513 is attached to the FPC 6503. A shift register 6515, a switch 6516, and memories (latches) 6517 and 6518 are provided in the driver circuit portion 6510. A shift register 6519 and a buffer 6520 are provided in the driver circuit portion 6512. Note that the driver circuit portion may be equipped with the other function besides the above. Moreover, the driver circuit portion is not necessary provided over the same substrate as the pixel portion 6511, and it may be provided outside the substrate by using an object (TPC) or the like formed by mounting IC chip on the FPC in which a wiring pattern is made.

Figure 17A:
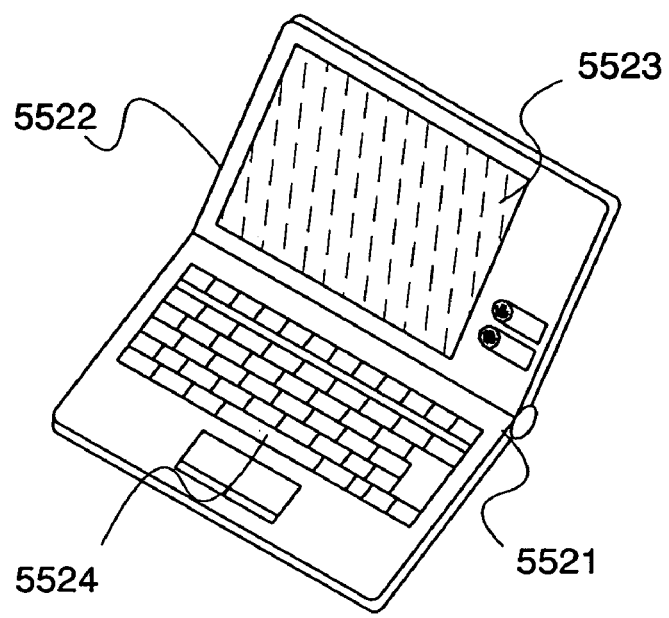
FIGS. 17A and 17B are views illustrating electronic apparatus applying the present invention.
Figure 17B:
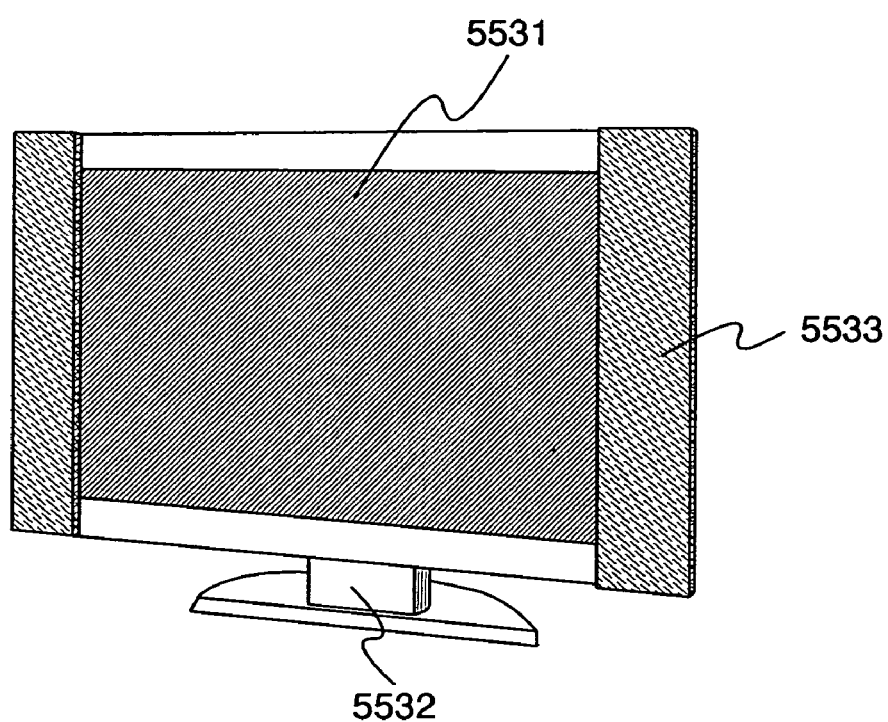

One embodiment of electronic apparatus mounting the light emitting device to which the invention is applied shown in FIGS. 17A and 17B.

FIG. 17A shows a laptop personal computer manufactured by applying the invention. The laptop personal computer includes a main body 5521, a casing 5522, a display portion 5523, a keyboard 5524 and the like. The personal computer can be completed by incorporating a light emitting device having a light emitting element according to the invention as a display portion.

FIG. 17B shows a television receiver manufactured by applying the invention. The television receiver includes a display portion 5531, a casing 5532, speakers 5533 and the like. The television receiver can be completed by incorporating a light emitting device having a light emitting element according to the invention as a display portion.

Although this embodiment describes the laptop personal computer, a light emitting device having a light emitting element according to the invention may also be mounted on a portable telephone, a car navigation system, a lighting instrument or the like.

What is claimed is:

1. A light emitting device comprising:
 a first insulating layer;
 a second insulating layer formed on the first insulating layer;
 a transistor formed on the second insulating layer;
 a third insulating layer covering the transistor;
 a first opening formed in the third insulating layer;
 a first electrode covering the first opening and the third insulating layer so as to be in contact with the first insulating layer;
 a bank layer covering the third insulating layer and the first electrode, wherein the bank layer has a second opening so as to expose the first electrode;
 a light emitting layer formed over the first electrode which is exposed in the second opening; and
 a second electrode formed over the light emitting layer.

2. The light emitting device according to claim 1, wherein the transistor is electrically connected to the first electrode through a connecting portion provided so as to penetrate the third insulating layer.

3. A laptop personal computer having the light emitting device according to claim 1.

4. A television receiver having the light emitting device according to claim 1.

5. A light emitting device comprising:
a first insulating layer;
a second insulating layer formed on the first insulating layer;
a transistor formed on the second insulating layer;
a third insulating layer covering the transistor;
a first opening formed in the third insulating layer;
a first electrode covering the first opening and the third insulating layer so as to be in contact with the first insulating layer;
a bank layer covering the third insulating layer and the first electrode, wherein the bank layer has a second opening so as to expose the first electrode;
a light emitting layer formed over the first electrode which is exposed in the second opening; and
a second electrode formed over the light emitting layer,
wherein the bank layer has a shape in which a radius of curvature varies continuously in an edge.

6. The light emitting device according to claim 5, wherein the transistor is electrically connected to the first electrode through a connecting portion provided so as to penetrate the third insulating layer.

7. A laptop personal computer having the light emitting device according to claim 5.

8. A television receiver having the light emitting device according to claim 5.

9. A light emitting device comprising:
a substrate;
a first insulating film formed over the substrate;
a transistor formed over the first insulating film;
a second insulating layer covering the transistor;
a first opening formed in the second insulating layer;
a first electrode covering the first opening and the second insulating layer so as to be in contact with the first insulating layer;
a bank layer covering the second insulating layer and the first electrode, wherein the bank layer has a second opening so as to expose the first electrode;
a light emitting layer formed over the first electrode which is exposed in the second opening; and
a second electrode formed over the light emitting layer,
wherein the first insulating layer prevents the diffusion of impurities and has a refractive index which is smaller than that of the first electrode and a refractive index which is larger than that of the substrate.

10. The light emitting device according to claim 9, wherein the transistor is electrically connected to the first electrode through a connecting portion provided so as to penetrate the second insulating layer.

11. The light emitting device according to claim 9, wherein the first electrode includes a conductive substance having light-transmitting properties.

12. A laptop personal computer having the light emitting device according to claim 11.

13. A television receiver having the light emitting device according to claim 11.

14. A laptop personal computer having the light emitting device according to claim 9.

15. A television receiver having the light emitting device according to claim 9.

16. A light emitting device comprising:
a first insulating layer;
a second insulating layer formed on the first insulating layer;
a transistor formed on the second insulating layer, wherein the transistor includes a channel region between a source region and a drain region, and a gate insulating film between the channel region and a gate electrode;
a third insulating layer covering the transistor;
a first opening formed in the third insulating layer;
a first electrode formed in the first opening so as to be in contact with the first insulating layer;
a bank layer covering the second insulating layer;
a second opening formed in the bank layer;
a light emitting layer being in contact with the first electrode which is exposed in the second opening; and
a second electrode formed over the light emitting layer.

17. The light emitting device according to claim 16, wherein the transistor is electrically connected to the first electrode through a connecting portion provided so as to penetrate the third insulating layer.

18. The light emitting device according to claim 16, wherein the first electrode includes a conductive substance having light-transmitting properties.

19. A light emitting device comprising:
a substrate;
a first insulating layer formed on the substrate;
a second insulating layer formed on the first insulating layer;
a transistor formed on the second insulating layer, wherein the transistor includes a channel region between a source region and a drain region, and a gate insulating film between the channel region and a gate electrode;
a third insulating layer covering the transistor;
a first opening formed in the third insulating layer;
a first electrode formed in the first opening so as to be in contact with the first insulating layer;
a bank layer having covering the second insulating layer;
a second opening formed in the bank layer;
a light emitting layer being in contact with the first electrode which is exposed in the second opening; and
a second electrode provided over the light emitting layer.

20. The light emitting device according to claim 19, wherein the transistor is electrically connected to the first electrode through a connecting portion provided so as to penetrate the third insulating layer.

21. The light emitting device according to claim 19, wherein the first electrode includes a conductive substance having light transmitting properties.

22. The light emitting device according to claim 19, wherein the substrate has a smaller refractive index than that of the first insulating layer, and wherein the first insulating layer has a smaller refractive index than that of the first electrode.

23. A laptop personal computer having the light emitting device according to claim 19.

24. A television receiver having the light emitting device according to claim 19.

25. A light emitting device comprising:
a substrate;
a first insulating layer formed on the substrate;
a second insulating layer formed on the first insulating layer;
a transistor formed on the second insulating layer, wherein the transistor includes a semiconductor layer including a channel region between a source region and a drain region, and a gate insulating film between the channel region and a gate electrode;
a third insulating layer covering the transistor;
a first opening formed in the third insulating layer;
a first electrode formed in the first opening so as to he in contact with the first insulating layer;
a bank layer covering the second insulating layer;

a second opening formed in the bank layer;
a light emitting layer being in contact with the first electrode exposed in the second opening; and
a second electrode formed over the light emitting layer.

26. The light emitting device according to claim 25, wherein the first electrode is electrically connected to the semiconductor layer through a connecting portion provided so as to penetrate the third insulating layer.

27. The light emitting device according to claim 25, wherein the first electrode includes a conductive substance having light transmitting properties.

28. The light emitting device according to claim 25, wherein the substrate has a smaller refractive index than that of the first insulating layer, and wherein the first insulating layer has a smaller refractive index than that of the first electrode.

29. A laptop personal computer having the light emitting device according to claim 25.

30. A television receiver having the light emitting device according to claim 25.

31. A light emitting device comprising:
a substrate;
a first insulating film formed over the substrate;
a transistor formed over the first insulating film;
a second insulating layer covering the transistor;
a first opening formed in the second insulating layer;
a first electrode covering the first opening and the second insulating layer so as to be in contact with the first insulating layer;
a bank layer covering the second insulating layer and the first electrode, wherein the bank layer has a second opening so as to expose the first electrode;
a light emitting layer formed over the first electrode which is exposed in the second opening; and
a second electrode formed over the light emitting layer.

32. The light emitting device according to claim 31, wherein the transistor is electrically connected to the first electrode through a connecting portion provided so as to penetrate the second insulating layer.

33. The light emitting device according to claim 31, wherein the first electrode includes a conductive substance having light transmitting properties.

34. The light emitting device according to claim 31, wherein the substrate has a smaller refractive index than that of the first insulating layer, and wherein the first insulating layer has a smaller refractive index than that of the first electrode.

35. A light emitting device comprising:
a substrate;
a first insulating film formed over the substrate;
a transistor formed over the first insulating film;
a second insulating layer covering the transistor;
a first opening and a second opening formed in the second insulating layer;
a wiring connected to the transistor through the first opening;
a first electrode connected to the wiring, wherein the first electrode is in contact with the first insulating layer in the second opening;
a bank layer covering the second insulating layer and the first electrode, wherein the bank layer has a third opening so as to expose the first electrode;
a light emitting layer formed over the first electrode which is exposed in the third opening; and
a second electrode formed over the light emitting layer.

36. The light emitting device according to claim 35, wherein the first electrode includes a conductive substance having light transmitting properties.

37. The light emitting device according to claim 35, wherein the substrate has a smaller refractive index than that of the first insulating layer, and wherein the first insulating layer has a smaller refractive index than that of the first electrode.

* * * * *